US011435661B2

United States Patent
Yang et al.

(10) Patent No.: US 11,435,661 B2
(45) Date of Patent: Sep. 6, 2022

(54) REFLECTIVE TYPE BLANKMASK FOR EUV, AND METHOD FOR MANUFACTURING THE SAME

(71) Applicant: S&S TECH Co., Ltd., Daegu-si (KR)

(72) Inventors: Chul-Kyu Yang, Daegu-si (KR); Gil-Woo Kong, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 32 days.

(21) Appl. No.: 16/951,329

(22) Filed: Nov. 18, 2020

(65) Prior Publication Data

US 2022/0066311 A1 Mar. 3, 2022

(30) Foreign Application Priority Data

Sep. 2, 2020 (KR) .................. 10-2020-0111917

(51) Int. Cl.
*G03F 1/24* (2012.01)
(52) U.S. Cl.
CPC ...................... *G03F 1/24* (2013.01)
(58) Field of Classification Search
CPC ........................................ G03F 1/24
USPC ........................................... 430/5
See application file for complete search history.

(56) References Cited

U.S. PATENT DOCUMENTS

| 9,046,776 B2* | 6/2015 | Hsu ........................... G03F 1/62 |
| 9,207,529 B2* | 12/2015 | Kinoshita ................. G03F 1/24 |
| 2006/0192147 A1 | 8/2006 | Kandaka et al. |
| 2013/0196255 A1 | 8/2013 | Hayashi |
| 2016/0202601 A1 | 7/2016 | Onoue |

FOREIGN PATENT DOCUMENTS

| JP | 2020106639 A | 7/2020 |
| KR | 1020060029039 A | 4/2006 |
| KR | 1020070017476 A | 2/2007 |
| KR | 1020160054458 A | 5/2016 |
| TW | 201333625 A | 8/2013 |
| TW | 201910905 A | 3/2019 |

* cited by examiner

*Primary Examiner* — Christopher G Young
(74) *Attorney, Agent, or Firm* — William Park & Associates Ltd.

(57) ABSTRACT

A blankmask for EUV includes a substrate, a reflection film that is stacked on the substrate; and an absorbing film that is stacked on the reflection film. The reflection film includes at least one Mo/Si layer that includes a Mo layer and a Si layer, and at least one Ru/Si layer that includes a Ru layer and a Si layer. Interdiffusion between the respective layers forming the reflection film is suppressed in a blankmask for EUV having a reflection film. Accordingly, the reflectance of the blankmask is improved, and the decrease in reflectance due to use after the manufacturing is prevented, thereby extending the life of the photomask.

18 Claims, 4 Drawing Sheets

REFLECTIVE TYPE BLANKMASK FOR EUV, AND METHOD FOR MANUFACTURING THE SAME

CROSS-REFERENCE TO RELATED APPLICATION

This application is based on and claims priority under 35 U. S. C. § 119 to Korean Patent Application No. 10-2020-0111917, filed on Sep. 2, 2020, the disclosure of which is herein incorporated by reference in its entirety.

BACKGROUND

1. Field

The disclosure relates to a blankmask for extreme ultraviolet (hereinafter. EUV) that uses extreme ultraviolet light used in semiconductor manufacturing as exposure light.

2. Discussion of Related Art

In order to refine a semiconductor circuit pattern, the use of 13.5 nm of extreme ultraviolet (EUV) as exposure light is being pursued. In the case of a photomask for forming a circuit pattern on a substrate using EUV, a reflective photomask that reflects exposure light and irradiates the reflected exposure light to a wafer is mainly used. FIG. 1 is a diagram illustrating an example of a reflective blankmask for manufacturing a reflective photomask, and FIG. 2 is a diagram illustrating a photomask manufactured using the blankmask of FIG. 1.

As illustrated in FIG. 1, a reflective blankmask for EUV includes a substrate 102, a reflection film 104 stacked on the substrate 102, an absorbing film 106 formed on the reflection film 104, and a resist film 108 formed on the absorbing film 106. The reflection film 104 is formed in a structure in which, for example, a layer made of Mo and a layer made of Si are alternately stacked, and serves to reflect incident exposure light. The absorbing film 106 is typically formed of a TaBN material or a TaBON material, and serves to absorb incident exposure light. The resist film 108 is used to pattern the absorbing film 106. As the absorbing film 106 is patterned into a predetermined shape as illustrated in FIG. 2, the blankmask is manufactured as the photomask, and the EUV exposure light incident on the photomask is absorbed or reflected according to the pattern of the absorbing film 106, and then is irradiated onto a semiconductor wafer.

In the existing reflective EUV blankmask, the reflection film 104 is structured by stacking a pair of Mo layer and Si layer in 40 to 60 layers, and therefore, there is a problem that interdiffusion occurs between the Mo layer and the Si layer. Specifically, the interdiffusion occurs between the Mo layer and the Si layer, and thus, a diffusion layer made of MoSi exists.

As main causes of the interdiffusion, there are heat applied during formation of each layer of the reflection film 104, heat applied during heat treatment for stress release of a thin film, heat applied to the reflection film 106 during coating of the resist film 108, heat energy applied to the reflection film 106 by EUV exposure light when the blankmask is used for a long time, and the like. FIG. 3 is a graph illustrating a phenomenon in which reflectance decreases due to the exposure light. Before exposure is performed using EUV with a wavelength of 13.5 nm, that is, before the blankmask is used, the reflectance is about 67%, and after the blankmask is exposed to the exposure light above a certain level, that is, after the blankmask is used for a certain period of time, the reflectance is about 59%, so it can be seen that the reflectance decrease of about 8% occurs.

As the interdiffusion proceeds, the reflectance of the reflection film 106 decreases, and as a result, the life of the blankmask is shortened. Therefore, there is a need for a method of preventing interdiffusion as much as possible to improve reflectance at the time of completion of manufacturing and to prevent a sharp decrease in reflectance due to use after manufacturing.

SUMMARY

The disclosure is to provide a method for suppressing interdiffusion between the respective layers forming a reflection film in a blankmask for EUV having a reflection film to improve reflectance of the blankmask at the time of completion of manufacturing and to prevent a decrease in reflectance due to use after manufacturing as much as possible.

According to an aspect of the disclosure, a blankmask for EUV includes: a substrate; a reflection film that is stacked on the substrate; and an absorbing film that is stacked on the reflection film. Here, the reflection film may include: at least one Mo/Si layer including a Mo layer made of a material containing Mo and a Si layer made of a material containing Si; and at least one Ru/Si layer including a Ru layer made of a material containing Ru and a Si layer made of a material containing Si.

The reflection film may have a lower region or an upper region that is formed in the Ru/Si layer.

The Mo/Si layer and the Ru/Si layer may be alternately disposed.

The Ru/Si layer may have a thickness of 6.8 to 7.1 nm, and the Ru layer and the Si layer in the Ru/Si layer may have a thickness ratio of 0.22:0.78 to 0.44:0.56.

The Ru layer may be preferably made of a Ru compound that further contains at least one of Mo, Nb, Zr, B, and C.

The Mo/Si layer may have a thickness of 6.8 to 7.1 nm, and the Mo layer and the Si layer in the Mo/Si layer may have a thickness ratio of 0.3:0.7 to 0.5:0.5.

The EUV blankmask of the disclosure may further include an intermediate layer that is formed on at least one or more of between the Mo layer and the Si layer in the Mo/Si layer and between the Ru layer and the Si layer in the Ru/Si layer to prevent the interdiffusion between the Mo layer and the Si layer or between the Ru layer and the Si layer.

The intermediate layer may be made of any one of B, $B_4C$, and C.

The intermediate layer may have a thickness of 1 nm or less.

The reflection film may have a thickness of 200 nm or more.

The reflection film may have a reflectance of 60% or more with respect to EUV exposure light.

The reflection film may have a change in reflectance of 2% or less after being heat-treated.

The reflection film may have a surface TIR value of 600 nm or less after being heat-treated.

The reflection film may have a surface roughness of 0.5 nm Ra or less.

The blankmask for EUV of the disclosure may further include a capping film formed on the reflection film.

The blankmask for EUV of the disclosure may further include a conductive layer formed on a backside of the substrate.

According to another aspect of the disclosure, a photomask manufactured using the blankmask configured as described above is provided.

According to the disclosure, the interdiffusion between the respective layers forming the reflection film is suppressed in a blankmask for EUV having a reflection film. Accordingly, the reflectance of the blankmask is improved, and the decrease in reflectance due to use after the manufacturing is prevented, thereby extending the life of the photomask.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Hereinafter, preferred embodiments of the disclosure will be described in more detail with reference to the drawings.

Figure 1:
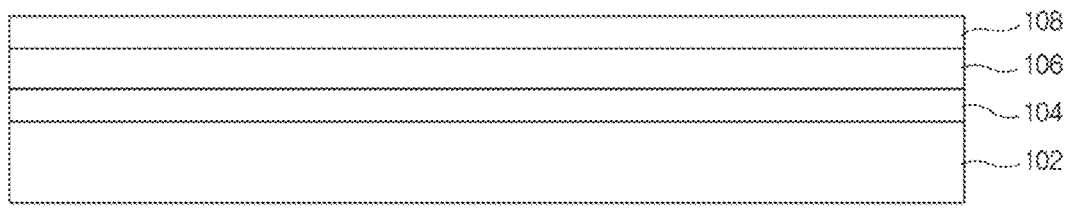
FIG. 1 is a diagram schematically illustrating a structure of a conventional general reflective blankmask for EUV.
Figure 2:
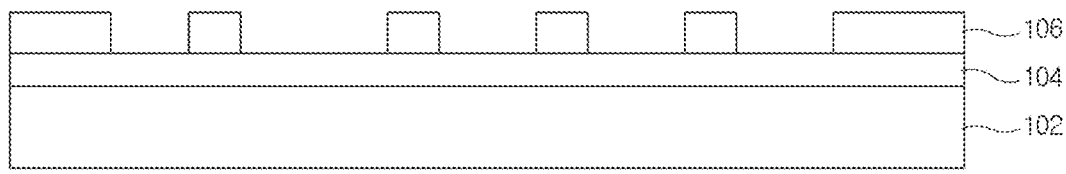
FIG. 2 is a diagram illustrating a photomask manufactured using the blankmask of FIG. 1.
Figure 3:
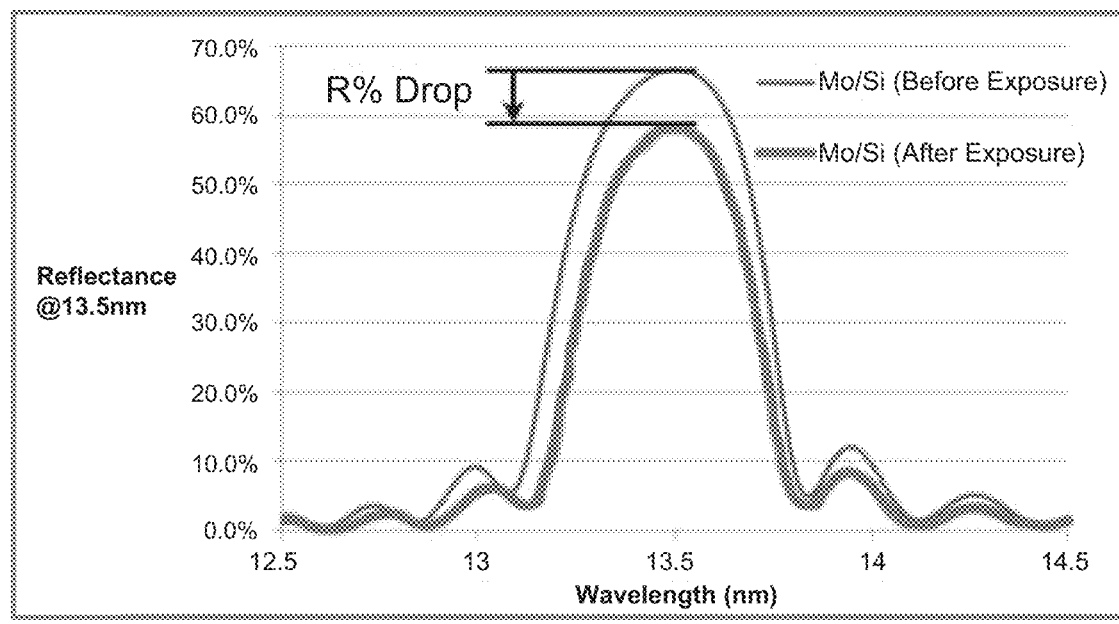
FIG. 3 is a graph illustrating a phenomenon in which reflectance decreases due to exposure light.
Figure 4:
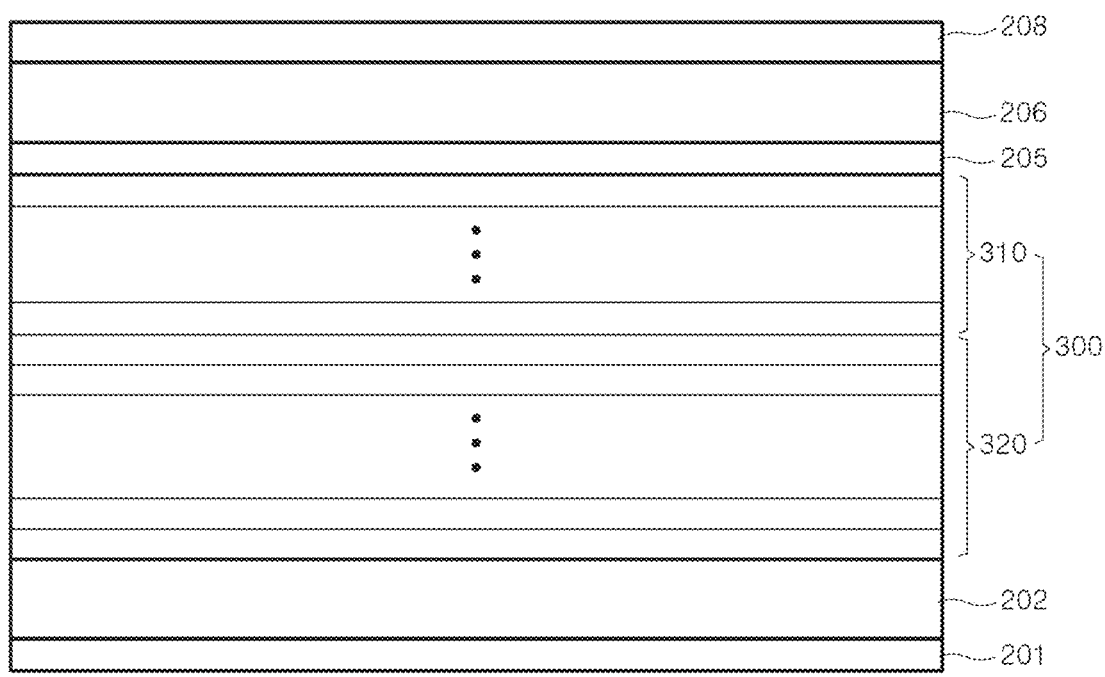
FIG. 4 is a diagram illustrating a structure of a reflective blankmask for EUV according to the disclosure.
Figure 5:
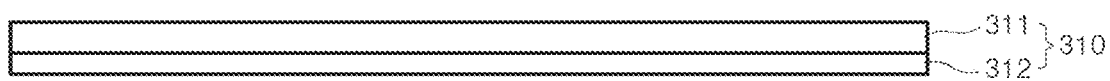
FIG. 5 is a diagram illustrating a Mo/Si layer of FIG. 4.
Figure 6:
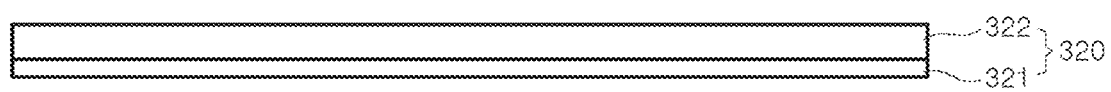
FIG. 6 is a diagram illustrating a Ru/Si layer of FIG. 4.

FIG. 4 is a diagram illustrating a structure of a reflective blankmask for EUV according to the disclosure, and FIGS. 5 and 6 each are diagrams illustrating a Mo/Si layer and a Ru/Si layer of FIG. 4.

The reflective blankmask for EUV according to the disclosure includes a substrate 202, a reflection film 300 that is stacked on the substrate 202, an absorbing film 206 that is formed on the reflection film 300, and a resist film 208 that is formed on the absorbing film 206. In addition, the blankmask of the disclosure further includes a conductive layer 201 that is formed on a backside of the substrate 202 and a capping film 205 that is formed between the reflection film 300 and the absorbing film 206. In addition to the illustrated components, the blankmask may further include a phase-shift film, an etch stop film, a hard mask film, and the like that are formed on an upper surface of the substrate 202, and may further include a defect control film, a conductive layer, and the like that are provided under the substrate 202.

The substrate 202 is a glass substrate for a reflective blankmask using EUV exposure light, and is configured as a low thermal expansion material (LTEM) substrate having a low coefficient of thermal expansion within the range of $0 \pm 1.0 \times 10^{-7}/°C$. and preferably $0 \pm 0.3 \times 10^{-7}/°C$. in order to prevent deformation of a pattern due to heat and stress during exposure. As the material of the substrate 202, $SiO_2$—$TiO_2$-based glass, multi-component glass ceramic, or the like may be used.

The substrate 202 needs to have high flatness in order to increase accuracy of reflected light during exposure. The flatness is represented by a total indicated reading (TIR) value, and it is preferable that the substrate 202 has a low TIR value. The flatness of the substrate 202 is 100 nm or less and preferably 50 nm or less in an area of 132 $mm^2$ or an area of 142 $mm^2$.

The reflection film 300 has a function of reflecting EUV exposure light, and is configured to include one or more Mo/Si layers 310 and one or more Ru/Si layers 310. The reflection film 300 is formed in pairs of 30 or more layers to secure a reflectance of exposure light of 60% or more, and in this case, has a thickness of 200 nm or more.

In the embodiment of FIG. 4, the reflection film 300 has a lower region that is formed in a Mo/Si layer 310 and an upper region that is formed in a Ru/Si layer 320. As an example, the reflection film 300 is formed by forming a 30-layer MoSi layer 310 on a lower portion thereof and a 10-layer Ru/Si layer 320 on an upper portion thereof. Since the upper region of the reflection film 300 is formed in the Ru/Si layer 320, the Ru/Si layer 320 which is the uppermost layer, in particular, the Si layer 322 comes into contact with the capping film 205 on the reflection film 300.

As illustrated in FIG. 5, the Mo/Si layer 310 is configured to include a Mo layer 311 made of a material containing Mo and a Si layer 312 made of a material containing Si.

One Mo/Si layer 310 has a thickness of 6.8 to 7.1 nm, and preferably has a thickness of 6.9 to 7.0 nm. When the thickness is out of this range, the reflection film 300 does not serve as a dielectric mirror, and thus the reflectance decreases sharply.

The Mo layer 311 and the Si layer 312 in one Mo/Si layer 310 have a thickness ratio of 0.3:0.7 to 0.5:0.5, and preferably a thickness ratio of 0.35:0.65 to 0.45:0.55. The thickness ratio of Mo and Si in the Mo/Si layer affects a central wavelength that shows the maximum reflectance, and in order to have a central wavelength of 13.4 to 13.6 nm, the Mo/Si layer needs to be formed within the corresponding thickness range. In addition, when the thickness is out of the range, the reflectance at the center wavelength of 13.4 to 13.6 nm decreases sharply, and the Mo/Si layer does not serve as the reflection film.

As illustrated in FIG. 6, the Ru/Si layer 320 is configured to include a Ru layer 321 made of a material containing Ru and a Si layer 322 made of a material containing Si.

One Ru/Si layer 320 has a thickness of 6.8 to 7.1 nm, and preferably has a thickness of 6.9 to 7.0 nm. When the thickness is out of this range, the reflection film 300 does not serve as the dielectric mirror, and thus the reflectance sharply decreases.

The Ru layer 321 and the Si layer 312 in one Ru/Si layer 321 have a thickness ratio of 0.22:0.78 to 0.44:0.56, and preferably a thickness ratio of 0.3:0.7 to 0.4:0.6. The thickness ratio of Ru and Si in the Ru/Si layer affects the central wavelength that shows the maximum reflectance, and in order to have the central wavelength of 13.4 to 13.6 nm, the Ru/Si layer needs to be formed within the corresponding thickness range. In addition, when the thickness is out of the range, the reflectance at the center wavelength of 13.4 to 13.6 nm decreases sharply, and the Mo/Si layer does not serve as the reflection film.

The Ru layer 321 may be made of a Ru compound that further includes at least one of Mo, Nb, Zr, B. and C together with Ru. Since a single Ru material has high crystallinity, a scattering phenomenon of EUV exposure light may appear within the Ru layer 321, and thus, a reflectance decreasing phenomenon may appear, so it is important to control crystallinity. By using the Ru compound, it is possible to improve the maximum reflectance by reducing the crystallinity of the thin film. Specifically, in order to reduce the crystallinity of the Ru target, a RuB target may be used, B or C may be formed as a barrier layer after Ru sputtering, and a deposition thickness of B or C is 2 nm or less and preferably 1 nm or less.

A film of the Ru material is less diffused by heat during the film formation, by heat during the coating of the resist film 208, and by the energy of the exposure light when exposed to the exposure light than a film of the Mo material. In the case of the diffusion layer, the degree of diffusion is determined by the degree of vacancy inside the thin film of each material. In the case of Ru, an elemental radius is 178 pm, which is lower than that of Mo which is 190 pm. Also, since Ru unilaterally has a hexagonal close packed lattice (HCP) structure, the Ru has a more compact structure than a body centered cubic lattice (BCC) structure of Mo. Thereby, the diffusion layer due to the above process appears lower than that of the film of the Mo material in the film of the Ru material.

Meanwhile, the reflection film 300 may be heat-treated using RTP, furnace, hot-plate, or the like after the film formation. When the heat treatment is performed, the stress of the reflection film 300 increases, thereby improving flatness. Preferably, the reflection film 300 is configured so that the surface TIR after the heat treatment is 600 nm or less, and more preferably 300 nm or less. When the surface flatness of the reflection film 300 is 600 nm or more, a pattern position error occurs.

The reflection film 300 has a reflectance of 60% or more and preferably a reflectance of 65% or more with respect to EUV exposure light of 13.5 nm.

The reflection film 300 has a surface roughness of 0.5 nm Ra or less, preferably 0.3 nm Ra or less, and more preferably 0.1 nm Ra or less in order to suppress diffuse reflection of the EUV exposure light.

Figure 7:
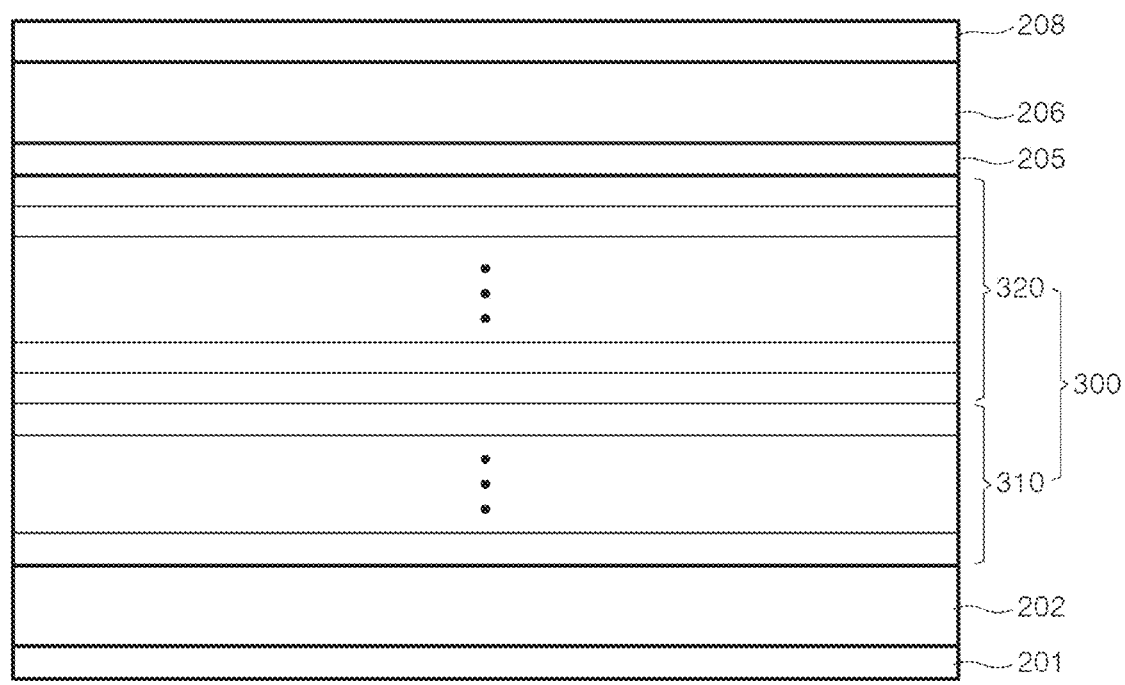
FIG. 7 is a diagram illustrating another example of FIG. 4.

FIG. 7 is a diagram illustrating another example of FIG. 4.

In the embodiment of FIG. 7, the reflection film 300 has the lower region formed in the Ru/Si layer 320 and the upper region formed in the Mo/Si layer 310. As an example, the reflection film 300 is formed by forming a 10-layer RuSi layer 320 on the lower portion thereof and a 30-layer Mo/Si layer 310 on the upper portion thereof. Since the lower region of the reflection film 300 is formed in the Ru/Si layer 320, the Ru/Si layer 320 which is the lowermost layer, in particular, the Ru layer 321 comes into contact with the substrate 202 under the reflection film 300.

Figure 8:
FIG. 8 is a diagram illustrating a modified example of FIG. 5 in which an intermediate film is formed on a Mo/Si layer.
Figure 9:
FIG. 9 is a diagram illustrating a modified example of FIG. 6 in which the intermediate film is formed on the Mo/Si layer.

FIG. 8 is a diagram illustrating a modified example of FIG. 5 in which an intermediate film is formed on a Mo/Si layer, and FIG. 9 is a diagram illustrating a modified example of FIG. 6 in which an intermediate film is formed on a Ru/Si layer. In this modified example, intermediate layers 313 and 323 are additionally formed between the Mo layer 311 and the Si layer 312, or between the Ru layer 321 and the Si layer 322, respectively.

The intermediate layers 313 and 323 are made of any one or more of B, $B_4C$, and C. The intermediate layers 313 and 323 serve to prevent interdiffusion by blocking direct contact between the Mo layer 311 and the Si layer 312 or the Ru layer 321 and the Si layer 322.

The intermediate layers 313 and 323 may be made of different materials for each layer. For example, the intermediate layer 313 of the Mo/Si layer 310 is formed using B, the intermediate layer 323 of the Ru/Si layer 320 is formed using C. or the intermediate layer 313 of each Mo/Si layer 310 may be formed of a different material for each Mo/Si layer 310.

Since the intermediate layers 313 and 323 may cause a decrease in reflectance of the reflection film 300, the intermediate layers 313 and 323 may be formed only in some of the layers in order to prevent the reflectance from decreasing.

In order to prevent the reflectance of the reflection film 300 from decreasing, the intermediate layers 313 and 323 are preferably as thin as possible, and preferably has a thickness of 1 nm or less. When the thickness of the intermediate layers 313 and 323 is 1 nm or more, the reflectance of the reflection film 300 may decrease with respect to EUV exposure light.

The capping film 205 is formed on the reflection film 300, and serves to protect the reflection film 300 thereunder during a dry etching process or a cleaning process for patterning the absorbing film 206. To this end, the capping film 104 is made of at least any one of Ru and Nb, or at least any one of a Ru compound and an Nb compound in which any one or more of C, N, and O is contained in Ru or Nb. At this time, it is preferable that the main element, Ru or Nb, has a content of 60 at % or more. In addition, the capping film 205 preferably has an etch selectivity of 10 or more with respect to the layer in contact with the capping film 205 in the absorbing film 206 thereon, that is, the lowermost layer in the absorbing film 206, and more preferably has an etch selectivity of 20 or more. When the etch selectivity is large, the capping film 205 is prevented from being etched during the patterning process of the absorbing film 206 thereon, so the reflection film 300 thereunder may be appropriately protected.

The capping film 205 has a thickness of 2 to 5 nm, and preferably a thickness of 2 to 3 nm. When the thickness of the capping film 205 is 2 nm or less, it is difficult to protect the reflection film 300 formed thereunder when the etching conditions (for example, over etching, and the like) are considered during the patterning process of the upper absorbing film 206, and when the thickness of the capping film 205 is 5 nm or more, the reflectance of the exposure light of 13.5 nm is attenuated, resulting in a problem that the image contrast decreases.

The absorbing film 206 is formed on the capping film 205 and serves to absorb the exposure light. Specifically, the absorbing film 206 has a reflectance of 10% or less and preferably a reflectance of 1 to 8% with respect to EUV exposure light having a wavelength of 13.5 nm, and thus absorbs most of the exposure light. The absorbing film 206 has a thickness of 70 nm or less, and preferably has a thickness of 60 nm or less. The absorbing film 206 may be made of a material such as TaN, TaBN, TaON, and TaBON.

The resist film 208 is made of a chemically amplified resist (CAR). The resist film 208 has a thickness of 150 nm or less and preferably 100 nm or less.

The conductive layer 201 is formed on the backside of the substrate 201. The conductive layer 201 has a lower sheet resistance value to serve to improve adhesion between an electronic-chuck and the blankmask for EUV, and prevent particles from being generated due to friction with the electronic-chuck. The conductive layer 201 has a sheet resistance of 100Ω/□ or less, preferably, 50Ω/□ or less, and more preferably 20Ω/□ or less. The conductive layer 201 may be configured in the form of a single film, a continuous film, or a multilayer film. The conductive layer 201 may be made of, for example, Cr as a main component, and when made of a two-layer multilayer film, the lower layer may contain Cr and N, and the upper layer may contain Cr, N, and O.

Hereinafter, specific implementation examples and comparative examples of the disclosure will be described.

Implementation Example 1

A conductive layer having a three-layer structure of a lower layer and an upper layer mainly made of Cr was formed on a backside of a $SiO_2$—$TiO_2$-based transparent substrate 202 using DC magnetron reactive sputtering equipment. All the conductive layers of the upper and lower layers were formed using a Cr target. The conductive layer that is a lower layer was formed of a CrN film having a thickness of 51 nm by injecting $Ar:N_2$=5 sccm:5 sccm as a process gas and using a process power of 1.4 kW. The conductive layer that is an upper layer was formed of a CrN film having a thickness of 15 nm by injecting $Ar:N_2$:NO=7 sccm:7 sccm:7 sccm as a process gas and using a process power of 1.4 kW. As a result of measuring the sheet resistance of the conductive layer 201 using a 4-point probe, it was confirmed that there is no problem in bonding with an electro-static chuck and there is no problem in using as the conductive layer by showing a sheet resistance value of 22.6 Ω/□.

A Ru layer and a Si layer were alternately stacked on the front side of the substrate 202 on which the conductive layer 101 is formed to form a lower portion of the reflection film 300 formed in a 10-layer Ru/Si layer 320. Then, a Mo layer and a Si layer were alternately stacked thereon to form an upper portion of the reflection film 300 formed in a 40-layer Mo/Si layer 310.

The reflection film 300 was formed by forming a Ru layer, a Mo layer, and a Si layer, respectively, in an Ar gas atmosphere after mounting Mo and Si targets on ion beam deposition-low defect density (IBD-LDD) equipment. Specifically, the lower region of the reflection film 300 was formed in a 10-layer Ru/Si layer 320 by forming the Ru layer to a thickness of 2.4 nm and forming the Si layer to a thickness of 4.5 nm, and the upper region of the reflection film 300 was formed in a 30-layer Mo/Si layer 310 by forming the Mo layer to a thickness of 2.8 nm and forming the Si layer to a thickness of 4.2 nm.

As a result of measuring the reflectance of the reflection film 300 at 13.5 nm using EUV reflectometer equipment, the reflectance was 66.8%, and as a result of measuring a stress of a thin film using ultra-flat equipment, TIR was 615 nm. Thereafter, as a result of measuring a surface roughness using AFM equipment, the surface roughness was 0.127 nm Ra.

The reflection film 300 was heat-treated at 350° C. for 10 minutes using RTP, the TIR measured after the heat treatment was 276 nm, and the reflectance at 13.5 nm was 65.1%.

A capping film 205 that has a thickness of 2.5 nm and is made of RuN was formed on the reflection film 300 in a nitrogen atmosphere by using IBD-LDD equipment and using a Ru target.

A two-layer absorbing film 206 was formed on the capping film 205 using a DC magnetron sputtering equipment. Specifically, the lower layer of the absorbing film 206 formed of a TaN film having a thickness of 50 nm was formed by using a Ta target on the capping film 205, injecting $Ar:N_2$=9 sccm:1 sccm as a process gas, and the process power of 0.62 kW. Thereafter, the upper layer of the absorbing film 206 that is made of a TaON film having a thickness of 2 nm was formed by using the same target, injecting $Ar:N_2$:NO=3 sccm: 20 sccm: 4.5 sccm as a process gas, and using a process power of 0.62 kW.

The absorbing film 206 manufactured in a two-layer stacked structure showed a reflectance of 2.6% with respect to a wavelength of 13.5 nm. As a result, it was determined that the reflectance can be controlled to be in the range of 1 to 10% by adjusting the thickness of the two-layer structure of the absorbing film 206.

The resist film 208 was spin coated on the absorbing film 206 to a thickness of 100 nm to complete the manufacturing of a blank mask for EUV.

Implementation Example 2

Implementation Example 2 was different from Implementation Example 1 only in the structure of the reflection film 300.

Specifically, a lower region of the reflection film 300 was formed in a 30-layer Mo/Si layer 310 by forming the Mo layer to a thickness of 2.8 nm and forming the Si layer to a thickness of 4.2 nm, and an upper region of the reflection film 300 was formed in a 10-layer Ru/Si layer 320 by forming the Ru layer to a thickness of 2.4 nm and forming the Si layer to a thickness of 4.5 nm.

As a result of measuring the reflectance of the reflection film 300 at 13.5 nm using EUV reflectometer equipment, the reflectance was 64.8%, and as a result of measuring a stress of a thin film using ultra-flat equipment, TIR was 593 nm. Thereafter, as a result of measuring a surface roughness using AFM equipment, the surface roughness was 0.135 nm Ra.

The reflection film 300 was heat-treated at 350° C. for 10 minutes using RTP, the TIR measured after the heat treatment was 290 nm, and the reflectance at 13.5 nm was 64.3%.

Thereafter, a capping film 104, an absorbing film 105, and a resist film 106 were formed to complete the manufacturing of the blank mask for EUV.

Comparative Example

Comparative Example is the same as the Implementation Example 1 described above except that a reflection film 300 is configured in a stacked structure of 40 Mo/Si cycles.

The reflection film was formed in a 40-layer Mo/Si layer by alternately forming a Mo layer and a Si layer in an Ar gas atmosphere after mounting a Mo target and a Si target in the IBD-LDD equipment. At this time, the Mo layer was first formed to a thickness of 2.8 nm, and the Si layer was formed to a thickness of 4.2 nm.

As a result of measuring the reflectance of the reflection film at 13.5 nm using EUV reflectometer equipment, the reflectance was 67.0%, and as a result of measuring a stress of a thin film using ultra-flat equipment, TIR was 625 nm. Thereafter, as a result of measuring a surface roughness using AFM equipment, the surface roughness was 0.125 nm Ra.

Thereafter, a capping film 205 that has a thickness of 2.5 nm and is made of RuN was formed on the reflection film in a nitrogen atmosphere by using IBD-LDD equipment and using a Ru target.

The reflection film was heat-treated at 350° C. for 10 minutes using RTP, the TIR measured after the heat treatment was 260 nm, and the reflectance at 13.5 nm was 58.2%, which showed a large reduction rate.

Hereinabove, the disclosure has been specifically described through the structure of the disclosure with reference to the accompanying drawings, but this structure is only used for the purpose of illustrating and explaining the disclosure, and is not used to limit the meaning or the scope of the disclosure described in the claims. Therefore, those having ordinary skill in the technical field of the disclosure can understand that various modifications and equivalent other structures are possible from the structure. Accordingly, an actual technical scope of the disclosure is to be defined by the spirit of the appended claims.

What is claimed is:

1. A blankmask for EUV, comprising:
a substrate;
a reflection film that is stacked on the substrate; and
an absorbing film that is stacked on the reflection film, wherein the reflection film includes:
at least one Mo/Si layer including a Mo layer made of a material containing Mo and a Si layer made of a material containing Si, and at least one Ru/Si layer including a Ru layer made of a material containing Ru and a Si layer made of a material containing Si, the Ru/Si layer has a thickness of 6.8 to 7.1 nm, and the Ru layer and the Si layer in the Ru/Si layer have a thickness ratio of 0.22:0.78 to 0.44:0.56.

2. The blankmask for EUV of claim 1, wherein the reflection film has a lower region that is formed in the Ru/Si layer.

3. The blankmask for EUV of claim 1, wherein the reflection film has an upper region that is formed in the Ru/Si layer.

4. The blankmask for EUV of claim 1, wherein the Mo/Si layer and the Ru/Si layer are alternately disposed.

5. The blankmask for EUV of claim 1, wherein the Ru layer is made of a Ru compound that further contains at least one of Mo, Nb, Zr, B, and C.

6. The blankmask for EUV of claim 1, wherein the Mo/Si layer has a thickness of 6.8 to 7.1 nm.

7. The blankmask for EUV of claim 1, wherein the Mo layer and the Si layer in the Mo/Si layer have a thickness ratio of 0.3:0.7 to 0.5:0.5.

8. The blankmask for EUV of claim 1, further comprising:
an intermediate layer that is formed on at least one or more of between the Mo layer and the Si layer in the Mo/Si layer and between the Ru layer and the Si layer in the Ru/Si layer to prevent the interdiffusion between the Mo layer and the Si layer or between the Ru layer and the Si layer.

9. The blankmask for EUV of claim 8, wherein the intermediate layer is made of any one of B, $B_4C$, and C.

10. The blankmask for EUV of claim 8, wherein the intermediate layer has a thickness of 1 nm or less.

11. The blankmask for EUV of claim 1, wherein the reflection film has a thickness of 200 nm or more.

12. The blankmask for EUV of claim 1, wherein the reflection film has a reflectance of 60% or more with respect to EUV exposure light.

13. The blankmask for EUV of claim 12, wherein the reflection film has a change in reflectance of 2% or less after being heat-treated.

14. The blankmask for EUV of claim 1, wherein the reflection film has a surface TIR value of 600 nm or less after being heat-treated.

15. The blankmask for EUV of claim 1, wherein the reflection film has a surface roughness of 0.5 nm Ra or less.

16. The blankmask for EUV of claim 1, further comprising:
a capping film formed on the reflection film.

17. The blankmask for EUV of claim 1, further comprising:
a conductive layer formed on a backside of the substrate.

18. A photomask manufactured using the blankmask of claim 1.

* * * * *